(12) United States Patent
Yu et al.

(10) Patent No.: US 8,915,619 B2
(45) Date of Patent: Dec. 23, 2014

(54) LIGHT EMITTING MODULE COMPRISING A THERMAL CONDUCTOR, A LAMP AND A LUMINAIRE

(75) Inventors: Jianghong Yu, Eindhoven (NL); Hendrik Johannes Jagt, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/118,560

(22) PCT Filed: May 15, 2012

(86) PCT No.: PCT/IB2012/052427
§ 371 (c)(1),
(2), (4) Date: Nov. 19, 2013

(87) PCT Pub. No.: WO2012/164426
PCT Pub. Date: Dec. 6, 2012

(65) Prior Publication Data
US 2014/0119024 A1 May 1, 2014

(30) Foreign Application Priority Data
Jun. 1, 2011 (EP) .................................. 11168348

(51) Int. Cl.
*F21V 29/00* (2006.01)
*F21V 9/16* (2006.01)
*F21S 6/00* (2006.01)
(Continued)

(52) U.S. Cl.
CPC ........... *F21V 29/22* (2013.01); *F21Y 2105/008* (2013.01); *F21V 29/242* (2013.01);
(Continued)

(58) Field of Classification Search
USPC .......... 362/84, 249.02, 294, 373, 800; 257/98
See application file for complete search history.

(56) References Cited

U.S. PATENT DOCUMENTS 7,750,358 B2 * 7/2010 Shiraishi et al. ................. 257/98
8,545,033 B2 * 10/2013 Gielen et al. ..................... 362/84
(Continued)

FOREIGN PATENT DOCUMENTS

| EP | 1786043 A1 | 11/2006 |
| WO | 2010136920 A1 | 12/2010 |

*Primary Examiner* — Stephen F Husar
(74) *Attorney, Agent, or Firm* — Yuliya Mathis

(57) ABSTRACT

A light emitting module (100), lamp and a luminaire are provided. The light emitting module (100) comprises a housing (106), a solid state light emitter (112), a luminescent element (102) and a thermal conductor (104). The housing (106) comprises a light exit window at a first side of the housing (106) and the housing (106) comprises a base (108) at a second side of the housing being different from the first side, the housing (106) enclosing a cavity (114) comprising cavity material being light transmitting. The solid state light emitter (112) is provided within the cavity (114) and is coupled to the base (108). The solid state light emitter (112) is configured to emit light of the first color range into the cavity (114). The luminescent element (102) being optically arranged in between the solid state light emitter (112) and the light exit window. The luminescent element (102) comprises luminescent material for converting at least a part of the light of the first color range into light of a second color range being different from the first color range. The thermal conductor (104) is arranged within the cavity (114) and has a thermal conductivity that is higher than a thermal conductivity of the cavity material. The thermal conductor (104) is thermally coupled to the luminescent element (102) and is thermally coupled to the base (108).

13 Claims, 6 Drawing Sheets

(51) Int. Cl.
| | | |
|---|---|---|
| *F21K 99/00* | (2010.01) | |
| *H01L 33/64* | (2010.01) | |
| *F21Y 105/00* | (2006.01) | |
| *F21V 3/00* | (2006.01) | |
| *F21Y 101/02* | (2006.01) | |
| *F21V 15/01* | (2006.01) | |
| *H01L 33/50* | (2010.01) | |

(52) U.S. Cl.
CPC ... *F21V 3/00* (2013.01); *F21V 9/16* (2013.01); *F21S 6/00* (2013.01); *F21Y 2101/025* (2013.01); *F21K 9/135* (2013.01); *H01L 33/644* (2013.01); *F21V 15/011* (2013.01); *H01L 33/507* (2013.01); *F21V 29/246* (2013.01); *F21Y 2101/02* (2013.01); *F21K 9/50* (2013.01); *F21K 9/17* (2013.01); *Y10S 362/80* (2013.01)
USPC ............... 362/294; 257/98; 362/84; 362/800

(56) References Cited

U.S. PATENT DOCUMENTS

| | | |
|---|---|---|
| 2009/0273002 A1 | 11/2009 | Chiou et al. |
| 2010/0308361 A1 | 12/2010 | Beeson et al. |
| 2011/0056734 A1 | 3/2011 | Andrews et al. |
| 2013/0334559 A1* | 12/2013 | Vdovin et al. ............ 257/98 |

* cited by examiner

LIGHT EMITTING MODULE COMPRISING A THERMAL CONDUCTOR, A LAMP AND A LUMINAIRE

CROSS-REFERENCE TO PRIOR APPLICATIONS

This application is a U.S. national stage application under 35 U.S.C. §371 of International Application No. PCT/IB2012/052427, filed on May 15, 2012, which claims priority to and the benefit of European Patent Application No. 11168348.8, filed on Jun. 1, 2011. These applications are hereby incorporated by reference herein.

FIELD OF THE INVENTION

The invention relates to light emitting modules comprising a luminescent element.

BACKGROUND OF THE INVENTION

Published patent application US2009/0322208A1 discloses a light emitting device. A Light Emitting Diode (LED) is provided within a conical cavity formed by a recessed housing. At the front side of the recessed housing the conical cavity is covered with a transparent thermal conductor layer on which a refractory phosphor layer is provided. At the backplane of the recessed housing is provided a heat sink and the side walls of the recessed housing are covered with a metal frame. The conical cavity may be filled with a material such as silicone.

The LED emits light towards the phosphor layer. A part of the light of the LED is converted by the phosphor layer into light of another color. Although the conversion of the color of light is relative efficient, still some energy is dissipated by the phosphor layer. Typically 20 to 30% of the energy of the converted light is lost due to Stokes shift induced by the phosphor layer and about 2 to 20% due to limited quantum efficiency. Especially when high power LEDs are used, the phosphor layer may become relatively hot which results in the degradation of the efficiency of the phosphor layer. The heat, which is generated in the phosphor layer of the light emitting device, is conducted by the transparent thermal conductor layer towards the metal frame which, subsequently, drains away the heat towards the heat sink.

Although the light emitting device provides the metal frame to conduct the heat away from the phosphor layer, the central area of the phosphor layer, which is an area of the phosphor layer that is located furthest away from the metal frame, becomes still relatively hot.

SUMMARY OF THE INVENTION

It is an object of the invention to provide a light emitting module with a luminescent element of which the temperature remains relatively low when the light emitting module is in operation.

A first aspect provides a light emitting module as described and claimed herein. A second aspect provides a lamp as described and claimed herein. A third aspect provides a luminaire as described and claimed. Advantageous further embodiments are defined in the description and the claims.

A light emitting module in accordance with the first aspect of the invention comprises a housing, a solid state light emitter, a luminescent element and a thermal conductor. The housing comprises a light exit window at a first side of the housing and the housing comprises a base at a second side of the housing being different from the first side, the housing enclosing a cavity comprising cavity material being light transmitting. The solid state light emitter is provided within the cavity and is coupled to the base. The solid state light emitter is configured to emit light of the first color range into the cavity. The luminescent element is optically arranged in between the solid state light emitter and the light exit window. The luminescent element comprises luminescent material for converting at least a part of the light of the first color range into light of a second color range being different from the first color range. The thermal conductor is arranged within the cavity and has a thermal conductivity that is higher than a thermal conductivity of the cavity material. The thermal conductor is thermally coupled to the luminescent element and is thermally coupled to the base.

The thermal conductor is thermally coupled to the luminescent element and the base and as such the thermal conductor provides a heat conductive path with a low thermal resistance between the luminescent element and the base which may be coupled to a heat sink. Thermally coupled means that the features that are thermally coupled have a direct contact or a contact via a coupling structure or material that conducts heat well, in other words, no heat insulation is present between the features that are thermally coupled. The coupling structure or material should also have a relatively good thermal conductivity compared to the thermal conductivity of the cavity material, or such a coupling structure or material is relatively thin such that its heat resistance is relatively low because the thermal path through such a coupling structure or material is relatively short. Thus, heat is better conducted from the luminescent element towards the base through the heat conductive path through the heat conductor than through the cavity material. Consequently, if the solid state light emitter is in operation, and the temperature of the luminescent element increases above the temperature of the thermal coupling interface, heat is conducted through the thermal conductor to the base such that the heat may, for example, be provided to the heat sink. Thus, the temperature of the luminescent element remains within acceptable boundaries if the solid state light emitter is in operation. This prevents degradation of the phosphor layer or a decrease of efficiency of the phosphor layer. The reduction of thermal gradients will also lead to a reduced thermal stress in the device, which is beneficial as thermo-mechanical stress may give rise to reliability issues, such as device failure due to delamination of layers or the formation of cracks.

It is to be noted that the base may have a relatively large heat capacity and consequently the base may act as a heat sink. Further, in other embodiments, the base may have fins for providing the received heat to the environment of the light emitting module. The base itself is at least partially heat conductive and is configured to receive heat from the thermal conductor. The least effect that is obtained by the heat conduction via the thermal conductor is that the temperature differences between the luminescent element and the base are reduced and if the base is configured to act as a heat sink or is configured to conduct the heat away to another heat sink, the obtain a further limitation of the temperature of elements of the light emitting module. In both cases the temperature of the luminescent element remains within acceptable boundaries.

The thermal conductor is provided within the cavity which means that the thermal conductor may be provided at almost every position within the cavity and as such it may be thermally coupled to any location of the luminescent element and to any location of the base to obtain an optimal effect with respect to heat conduction away from the luminescent element towards the thermal coupling interface. This is advantageous because it allows a design of a light emitting module that uses a minimal amount of (heat conducting) elements to obtain the best heat conduction away from the luminescent element.

It is to be noted that the skilled person would not consider the use of a heat conductor within the cavity because the cavity has the function of transmitting light from the light source towards the luminescent element and/or to the light exit window and the cavity has the function of mixing light of different colors. The skilled person expects that the heat conductor would disturb these functions and as such the skilled person would opt a cavity that is homogeneously filled with one cavity material which mainly contributes to the functions of light transmission and light mixing.

Optionally, the base comprises a thermal coupling interface for thermally coupling the light emitting module to a heat sink. Thus, the thermal coupling interface is thermally coupled to the thermal conductor and heat of the luminescent element may be conducted towards the heat sink.

Optionally, the thermal conductor is of a light transmitting material and is optically coupled to the cavity material. The thermal conductor may disturb the optical path of the light that is emitted by the light source and/or emitted by the luminescent element towards the light exit window. Further, the thermal conductor may absorb light. If the thermal conductor is of a light transmitting material and is optically coupled to the cavity material, the distortion of the paths of the emitted light is reduced and the loss of light is prevented. Further, if the thermal conductor is also optically coupled to the luminescent material, light transmitted through the thermal conductor may directly be emitted into the luminescent element and as such it is prevented that dark sports are visible in the luminescent element to a viewer who looks towards the light emitting module.

Optionally, the thermal conductor is made of at least one of the following materials: copper, aluminum, an alumina ceramic, a boron nitride ceramic, aluminum nitride ceramic, beryllium oxide ceramic, zinc oxide ceramic, zinc, and silver. The materials have a high thermal conductivity and as such a relatively large amount of heat generated in the luminescent element may be conducted away from the luminescent material such that the temperature of the luminescent element is kept within acceptable boundaries. Further, some of the materials are light reflective (for example, some of the metals, or a dense boron nitride ceramic with a cubic crystal structure) and do not absorb much light that impinges on the thermal conductor and as such the efficiency of the light emitting module is not reduced much by the thermal conductor.

Other examples of metals which may be used for the thermal conductor are: molybdenum, chrome, tungsten or alloys such as brass, bronze, steel. Other examples of ceramics which may be used for the thermal conductor are sapphire, halfniumoxide, yttriumoxice, zirconia, yttrium aluminium garnet (YAG). The thermal conductor may also be manufactured of glass materials, such as, borosilicate glass, sodalime glass, fused silica, quartz glass. The thermal conductor may also be made of polymers, such as silicone resins, thermal adhesives, thermally conductive polymers filled with thermally conductive particle. Other advantageous materials are carbon, graphite or graphene. The above given examples may also be used in combination with each other. The most relevant characteristic of the material of the thermal conductor is that the thermal conductivity of the material of the thermal conductor is better than the thermal conductivity of the cavity material.

Optionally, a first surface of the thermal conductor, which faces the cavity, is light reflective or a light reflective layer is provided on the first surface. Thus, the interface between the thermal conductor and the cavity is light reflective. This prevents that light which impinges from the cavity on the thermal conductor is absorbed and thereby reduces the efficiency of the light emitting module. This is especially advantageous when the thermal conductor is not light transmitting. The light reflective layer maybe a coating or a molded layer or a reflective shell insert around a thermally conductive material that is less light reflective. Materials that may be used in the light reflective layer are, for example, a ceramic shell such as reflective Al2O3, or zirconia; a metallic surface layer, such as a thin film silver or aluminum layer, or a reflective coating of pores or pigments such as $TiO_2$, $Al_2O_3$ or BN or zirconia or hafniumoxide or yttriumoxide embedded in a binder, such as a polymer, e.g. a polyamide, an epoxy, a polyester, a silicone resin or a silicate or alkylsilicate or a fluoro polymer, e.g. a Teflon material. The reflective layer may also be a multilayer reflector such as a dichroic filter. The light reflective layer may be a coating provided on the first surface.

Optionally, a second surface of the thermal conductor that is facing towards the luminescent element is light reflective or a light reflective layer is provided on the second surface. Thus, the interface between the luminescent element and the thermal conductor is light reflective. If the thermal conductor is not light transmitting, no light is able to enter the luminescent material at the location where the thermal conductor touches the luminescent element and as such dark spots may be seen by a viewer who looks towards the light emitting module. Light may be lightguided within the luminescent element and light of a color in the second color range is emitted by the luminescent material of the luminescent element. The light guided light and the light of the color in the second color range may impinge on the second surface and because this light is reflected by the light reflective second surface, the dark sports are reduced and a more homogeneous light output distribution may be obtained along the light exit window. Materials that may be used in the light reflective layer are pigments such as, for example, $TiO_2$, $Al_2O_3$, BN and ZnO. The light reflective layer may be based on a polymeric binder, such as silicone, silicate or alkylsilicate. The light reflective layer may be a coating provided on the second surface. Examples of such coatings are a layer of aluminum, silver. Further, the light reflective layer may be a reflector, such as, for example, a multilayer reflector or a dichroic reflector. Further, the light reflective layer may be an adhesive that is applied between the thermal conductor and the luminescent element that is light reflective. Other examples of advantageous materials are discussed above where advantageous light reflective materials are discussed to be used on the first surface of the thermal conductor.

Optionally, a shape of a cross-section of the thermal conductor along an imaginary plane parallel to the base is a circle, an ellipse or a hexagon. A circular or ellipse shaped cross-section is advantageous because it provides an advantageous light reflection without discrete transitions between reflection surfaces. The circular shaped cross-section is relatively efficiency with respect to use of space within the cavity. The thermal conductor with the hexagonal shaped cross-section provides additional thermal conductive material to conduct more heat compared to the circular cross-shaped thermal conductor, while at the same time the use of space within the cavity is relatively low. It is to be noted that the invention is not limited to the shapes of the cross-sections of the thermal conductor mentioned above. Any shape may be possible. Other examples of the shape of the cross-section of the thermal conductor are: a square, a rectangle, a triangle, a star, etc. It is further to be noted that the cross-section of the thermal conductor may change as a function of a distance towards the luminescent element. For example, the thermal conductor may be conical and as such the diameter of the circle of the cross-section of the thermal conductor reduces towards the luminescent element. Further, the shape of the cross-section of thermal conductor near the base may be square, while the cross-section of the thermal conductor near the luminescent element is circular. Further, the thermal conductor may have holes to allow light transmission through the holes.

Optionally, the base is a heat conductive printed circuit board.

A heat conductive base or a base that is a heat conductive printed circuit board provides an advantageous thermal coupling between the thermal conductor and the thermal coupling interface such that heat generated in the luminescent element is well conducted towards a heat sink that is coupled. By using the base to conduct the heat from the thermal conductor inside the cavity, towards a side of the base outside the cavity, the thermal coupling interface may be arranged at the back side of the light emitting module. The back side is in general an advantageous position for the heat sink because it is relatively far away from the light exit window and as such it is relatively easy to cover the heat sink such that it is not visible for the viewer. In another embodiment, the thermal coupling interface is provided at another location, such as, for example, at an outside surface of a wall being interposed between the luminescent element and the base.

Optionally, the thermal conductor is coupled to the base and/or to the luminescent element with a heat conductive adhesive for providing a thermal coupling between the thermal conductor and the base and/or between the thermal conductor and the luminescent element.

Optionally, a position of the thermal conductor within the cavity is defined by at least one of the following criteria:

i) the thermal conductor touches the luminescent element at a specific point where the luminescent element would have the highest temperature if the solid state light emitter is in operation and if the thermal conductor would not be available, ii) the length of the thermal conductor is minimal at the position, iii) the light output is maximal compared to another position of the thermal conductor within the cavity, iv) the light output along the light exit window is to a maximum degree homogeneous compared to another position of the thermal conductor within the cavity. The first criterion means that the thermal conductor is thermally coupled to the luminescent element at a location where, if the thermal conductor is not present, the temperature of the luminescent element at the location will be higher than the other location of the luminescent where the thermal conductor could be coupled to the thermal conductor. If the thermal conductor is coupled to such a location, the heat flow through the thermal conductor towards the thermal coupling interval will be relatively large, compared to the heat flow if the thermal conductor was coupled to the luminescent element at another location. The second criterion means that the position of the thermal conductor is chosen such that length of the thermal conductor is relatively short and is, consequently, a good thermal conductor. The third and fourth criteria imply that the position is optimized to prevent the distortion of the light beam from the solid state light emitter towards the luminescent element. This means that, if another position would be chosen, the distortion would be more, which means that, for example, the efficiency of the light emitting module reduces or a less homogeneous light output is obtained. It is to be noted that different criterion may be used to find an optimum between different parameters depending on the specific requirements of the light emitting module.

Optionally, the light emitting module comprises a plurality of thermal conductors. Each thermal conductor is arranged within the cavity and having a thermal conductivity that is higher than a thermal conductivity of the cavity material. Each thermal conductor is thermally coupled to the luminescent element and is thermally coupled to the base. The use of a plurality of thermal conductors allows more heat to be conducted towards base and as such is the temperature within the luminescent element kept within acceptable boundaries. Further, by using more thermal conductors, more optimization parameters become available which may be used to still obtain a relative high light output from the light emitting module, while the temperature gradient within the luminescent element is, in operation, relatively flat, which means that temperature differences within the luminescent element are small.

Optionally, the housing comprises a wall of a material that has a thermal conductivity that is higher than the thermal conductivity of the cavity material. The wall is interposed between the light exit window and the base and the wall is thermally coupled to the luminescent element and the base. The thermal conductive wall is an additional measure to conduct heat away from the luminescent material towards the thermal coupling interface. The use of the wall for this purpose as well is especially advantageous if the luminescent element is a layer which covers the complete light exit window and if the light exit window completely extends along the wall. It is to be noted that, in an embodiment, the outside surface of the wall may be a thermal coupling interface or may act as a further heat sink.

According to a second aspect of the invention, a lamp is provided which comprises a light emitting module according to the first aspect of the invention.

According to a third aspect of the invention, a luminaire is provided which comprises a lamp according to the second aspect of the invention or which comprises a light emitting module according to the first aspect of the invention.

The lamp according to the second aspect of the invention and the luminaire according to the third aspect of the invention provide the same benefits as the light emitting module according to the first aspect of the invention and have similar embodiments with similar effects as the corresponding embodiments of the system.

These and other aspects of the invention are apparent from and will be elucidated with reference to the embodiments described hereinafter.

It will be appreciated by those skilled in the art that two or more of the above-mentioned embodiments, implementations, and/or aspects of the invention may be combined in any way deemed useful.

Modifications and variations of the light emitting module, lamp and/or luminaire, which correspond to the described modifications and variations of the light emitting module, can be carried out by a person skilled in the art on the basis of the present description.

Figure 1:
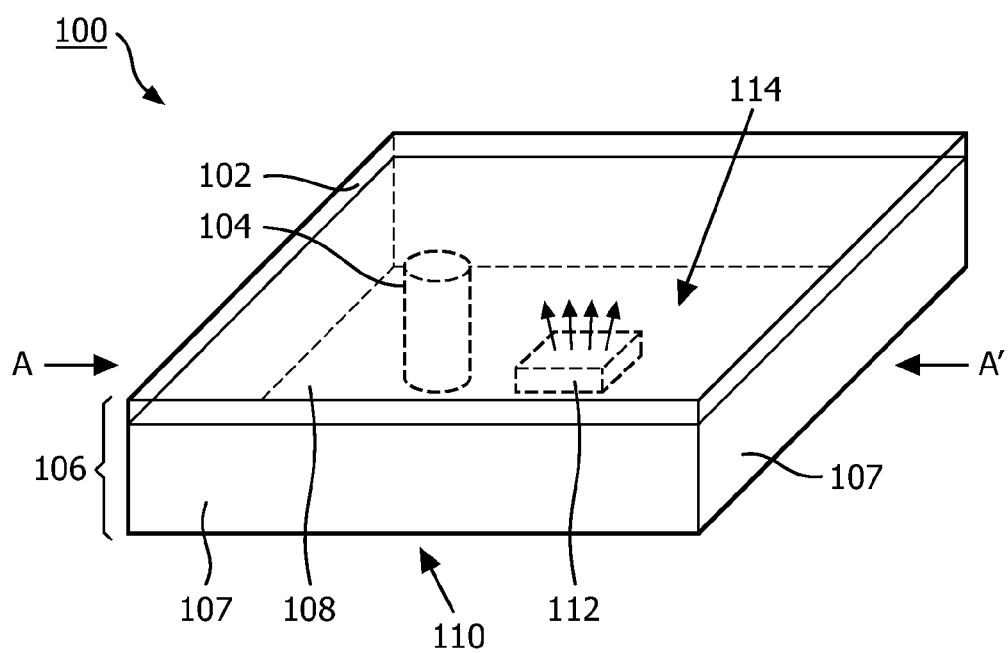
FIG. 1 schematically shows an embodiment of a light emitting module according to the first aspect of the invention, FIG. 2a schematically shows a cross-section of the light emitting module of FIG. 1 along line A-A', FIG. 2b schematically shows two cross-sections of a part of embodiments of the light emitting modules according to the first aspect of the invention, FIG. 3a schematically shows a cross-section of an embodiment of a light emitting module comprising a plurality of light emitting modules and having a heat conductive wall, FIG. 3b schematically shows the effect of the thermal conductor on a temperature gradient of the luminescent element, FIGS. 4a to 4c schematically show cross-sections of three variants of a light emitting module, FIG. 5a schematically shows an embodiment of a thermal conductor, FIG. 5b schematically shows an alternative embodiment of a light emitting module, FIG. 6a schematically shows a lamp according to the second aspect of the invention, and FIG. 6b schematically shows a luminaire according to the third aspect of the invention.

It should be noted that items denoted by the same reference numerals in different Figures have the same structural features and the same functions, or are the same signals. Where the function and/or structure of such an item have been explained, there is no necessity for repeated explanation thereof in the detailed description.

The figures are purely diagrammatic and not drawn to scale. Particularly for clarity, some dimensions are exaggerated strongly.

DETAILED DESCRIPTION

A first embodiment is shown in FIG. 1. A light emitting module 100 is schematically presented. The light emitting module 100 has a housing 106 which comprises walls 107 and a base 108. The housing has a light exit window which is formed by a luminescent element 102. In the specific embodiment of FIG. 1 the luminescent element 102 is drawn as a layer. The luminescent element 102 comprises luminescent material, for example, dispersed in or molecularly dissolved in a transparent matrix polymer. In other embodiments, the luminescent element 102 may have different shapes or may be formed by a transparent substrate on which luminescent material is provided. The luminescent material may be any material that is able to convert light of a first color into light of a second color, such as an organic luminescent material, an inorganic phosphors, a quantum dot material, or combination thereof. The luminescent element 102 may consist of a single layer or multiple layers. Each layer may contain a single luminescent material or a combination of different luminescent materials. Further the luminescent element may be a ceramic phosphor. The housing 106 encloses a cavity 114. At a side of the base 108, which is the side of the base 108 that is facing towards the cavity 114, is provided a solid state light emitter 112 which emits, in operation, light towards the luminescent element 102. The solid state light emitter 112 emits light in a first color range, and the luminescent material in the luminescent element 102 absorbs a part of the light in the first color range and emits a part of the absorbed light as light in a second color range. The total light emission by the light emitting module 100 is a combination of a portion o the light emitted by the light emitter 112, which is the light that is not being absorbed by the luminescent element 102, and the light emitted by the luminescent material of the luminescent element 102. The housing 106 has at a side, which is drawn in FIG. 1 as the back side of the light emitting module 100, a thermal coupling interface 110. A heat sink may be coupled to the thermal coupling interface 110. The thermal coupling interface 110 is, for example, a surface which is relatively well heat conducting and is thermally coupled to the solid state light emitter 112 for receiving the heat generated by the solid sate light emitter 112. The cavity 114 is filled with a light transmitting material. The light transmitting material may be a gas, such as air, a liquid, such as silicone oil or a mineral oil, or may be another material, such as silicone, silicate, alkyl-silicate, a glass or a ceramic. The light emitting module 100 further comprises a cylindrical shaped thermal conductor 104. The thermal conductor 104 is positioned in the cavity 114 such that it is in contact with the luminescent element 102 and with the base 108. The direct contact between the luminescent element 102 and the thermal conductor 104 leads to a relatively good thermal coupling between the luminescent element 102 and the thermal conductor 104. The base 108 provides thermal coupling between the thermal conductor 104 and the thermal coupling interface 110. In another embodiment (not shown), the thermal conductor may extend through the base 108 towards the thermal coupling interface. The thermal conductor is of a material that has a thermal conductivity that is at least higher than the thermal conductivity of the material in the cavity 114.

If the solid light emitter 112 is in operation, which means that the solid state light emitter 112 emits light in a first color range, the luminescent element 102 absorbs some of the light in the first color range and converts the absorbed light towards light in a second color range. As described earlier, the conversion is not 100% efficient and some heat is generated within the luminescent element 102. The luminescent material may have a limited quantum efficiency of, for example, 80 to 90% resulting in 20 to 10% of the light of the solid state light emitter 112 being converted towards heat. Further, a Stokes shift loss, which can be in the order of 20 to 30%, result in the conversion from light towards heat. The luminescent element 102 may become relatively hot, while the other parts of the light emitting module 100 remain relatively cool because of the cooling by a heat sink that is coupled to the thermal coupling interface 110. Because of the temperature gradient along the thermal conductor, heat is transported from the luminescent element 102 towards the thermal coupling interface 110 and as such to the heat sink. Thus, the temperature of the luminescent element 102 does not become too high, because if the temperature of the luminescent element 102 increases, more heat is transported away from the luminescent element 102 towards the heat sink.

Examples of solid state light emitters that may be used in the light emitting module 100 are a light emitting diode, a laser diode or an organic light emitting diode.

Air has a thermal conductivity coefficient of 0.027 W/mK and if the cavity 114 is filled with air, the thermal conductor 104 may be made of, for example, silicone which has a thermal conductive coefficient of 0.1-0.3 W/mK. In such a case, more suitable materials for the thermal conductor 104 are: glass, which has a thermal conductivity of 1 W/mK, ceramic alumina or sapphire with a thermal conductivity coefficient of about 30 W/mK, aluminum with a thermal conductivity coefficient of 160-270 W/mK, or copper with a thermal conductivity of 380 W/mK. Silicone, or glass are light transmitting and therefore they may be used to create light transmitting thermal conductors 104. It is to be noted that the suitable materials for the thermal conductor 104 are not limited to the discussed materials. Any material with a higher thermal conductivity coefficient than the thermal conductivity coefficient of the cavity material is an advantageous material. Further, because silicone and glass are light transmitting they may be used as cavity material in a specific embodiment as well. As such, in this specific embodiment, the thermal conductivity coefficient of the material of the thermal conductor has to be higher than the thermal conductivity coefficient of silicone or glass.

The thermal conductor 104 may also comprise a heat spreading grid, such as a metal grid, and some further heat conducting elements. The heat spreading grid may be in contact with the luminescent element 102, and the further heat conducting elements are thermally coupled to the heat spreading grid and the base 108.

A transparent heat conductive material may also be used at the top of the heat conductor 104 where the heat conductor 104 is in contact with the luminescent element 102. The transparent heat conductive material may be, for example, a film or coating of ITO or IZO material.

Figure 2A:
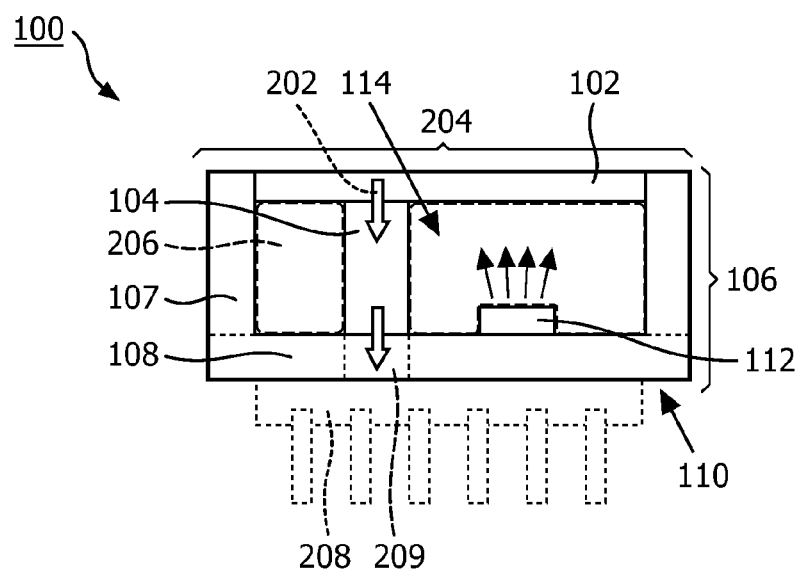

FIG. 2a schematically presents a cross-section of the light emitting module 100 of FIG. 1 along a line A-A'. The housing 106 of the light emitting module 100 consists of walls and the base 108. The base 108 may have a thermal via 209 which is filled with a material that has a relatively high thermal conductivity coefficient. However, if the base 108 is a relative good heat conductor or is very thin, such a thermal via 209 is not required.

The housing 106 encloses a cavity 114 and has a light exit window 204. Light generated by the elements of the light emitting module 100 are emitted through the light exit window 204 into the ambient of the light emitting module 100. In the embodiment of FIG. 2a the light exit window 204 is formed by the luminescent element 102. In other embodiments the luminescent element may be located at another position, for example, at a position closer to the solid state light emitter 112.

The cavity 114 is filled with the light transmitting material 206. Further, inside the cavity 114, on the base 112, is provided the solid state light emitter 112 which emits, in operation, light of the first color towards the luminescent element 102. Within the cavity 114 is further provided the thermal conductor 104 which is capable of conducting heat 202 from the luminescent element 102 towards the thermal coupling interface 110.

In the embodiment of FIG. 2a is the thermal coupling interface 110 provided at a side of the base 108 that is opposite a side of the housing that faces the cavity. The thermal coupling interface 110 may also be provided at other surfaces of the housing 106.

A heat sink 108 is coupled to the thermal coupling interface 110 for providing heat to the ambient of the light emitting module 100.

The thermal conductor 104 is connected to or part of thermally conductive patterns and/or vias 209 present in the base 108, for example, as present on/in a multi-layer FR4 printed circuit board equipped with thermal vias 209. Further, the thermal conductor 104 and the base 108 with the via 209 may be manufactured as a single element and such that the thermal conductor 104 becomes a part of the base 108.

In an embodiment, the thermal conductor 104 is light transmitting and is optically coupled to the cavity material 206. Thus, the cavity material 206 and the thermal conductor 104 optically form one entity. Light, which is transmitted through the cavity 114, may also be transmitted through the thermal conductor 104 and may be transmitted into the luminescent element 102 in an area where the luminescent element 102 is in contact with the thermal conductor 104. This prevents distortions of the light paths through the cavity 114 and prevent that a dark spot is visible for a viewer who looks towards the luminescent element 102. Further, the luminescent element 102 may cover a part of the light exit window 204 which allows some direct emission of light from the solid state light emitter 112. Further, the luminescent element 102 may comprise multiple luminescent materials and/or luminescent layers. Between the luminescent materials and/or the luminescent layers may be present intermediate carriers or adhesive layers. One of the luminescent materials or one of the luminescent layers may also be present inside the cavity 114.

Figure 2B:
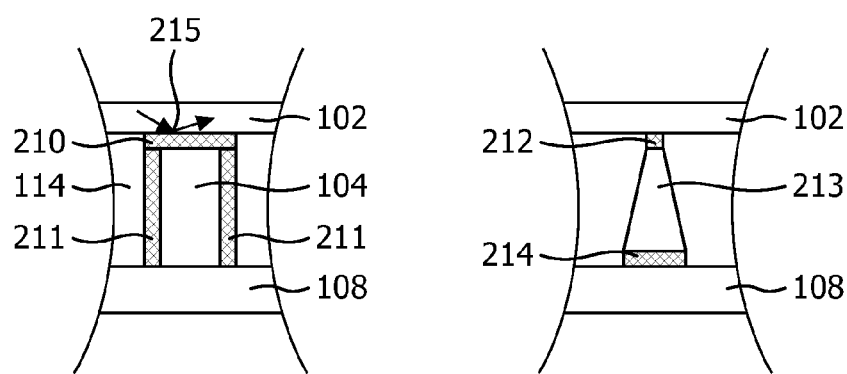

In FIG. 2b two embodiments are present which show how contact between the thermal conductor 104 and the luminescent element 102 and/or the base 108 may be arranged.

In the left end of FIG. 2b a first surface of the thermal conductor 104 is coated with a light reflective material 211. The first surface is facing towards the cavity 114. The coating of a light reflective material 211 prevents that light is absorbed by the thermal conductor 104. Further, a second surface of the thermal conductor 104 is coated with a light reflective material 210. The second surface is facing towards the luminescent element 102. Especially when the thermal conductor 104 is not light transmitting, it is advantageous to provide such a light reflective material on the second surface such that light which is guided through the luminescent element 102 or light that is generated within the luminescent element 102 is reflected towards the light exit window 204 for being emitted into the ambient of the light emitting module 100. The reflection of light is indicated in at position 215 in FIG. 2b. This prevents a dark spot being visible in the luminescent element 102 at the position where the thermal conductor 104 touches the luminescent element 102.

The first surface may be coated with the light reflective material 211, or the second surface may be coated with the light reflective material 210, or both surfaces may be coated with the light reflective material. The first surface may also be provided with a light reflective layer which is manufactured by arranging a cylinder of a light reflective material around the thermal conductor 104, for example, the cylinder may be manufactured of a light reflective ceramic and the thermal conductor may be a metal pin arranged within the cylinder.

At the right end of FIG. 2b the thermal conductor 113 is thermally coupled to the luminescent element 102 with a heat conductive adhesive 212 and the thermal conductor 104 is coupled to the base 108 with another or the same type of heat conductive adhesive 214. The heat conductive adhesive 214 may extend parallel to the luminescent element 102 to serve as an adhesive between the cavity material 206 and the luminescent element 102 as well. Especially, if the thermal conductor 104 is light transmitting, it is advantageous to have a heat conductive light transmitting adhesive 212, and if the thermal conductor 104 is not light transmitting, it is advantageous to have heat conductive light reflective adhesive 212. Further, the shape of the thermal conductor 213 is conical. Especially if the thermal conductor 213 is not light transmitting, it is advantageous to have a conical thermal conductor 213 because the size of the contact area between the thermal conductor 213 and the luminescent element 102 is small and only small darker sport may be visible at the light exit window, and the conical shape may assist in reflecting light towards to luminescent element 102 such that a maximum amount of light is emitted into the ambient by the light emitting module.

In another embodiment, the thermal conductor 102 may not be in thermal contact with the cavity material 206. The cavity material may be a solid layer of silicone, glass or a ceramic equipped with holes, and a plurality of thermal conductors 102 are provided within the holes and an air gap may be present between the thermal conductors 102 and the cavity material 206. Such an air gap gives rise to an optical advantage of extra strong light reflections at the interface between the cavity material 206 and the air and, as such, the interaction between the light and the thermal conductors 102 is reduced, which reduces, for example, the absorption of light when the thermal conductors 102 are not light reflective.

Figure 3A:
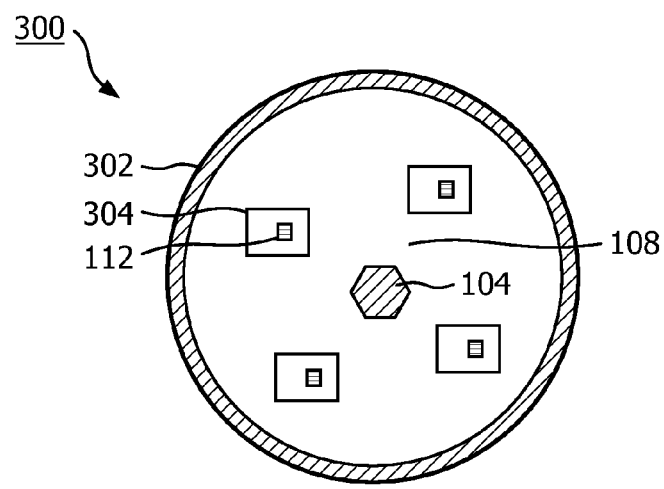

In FIG. 3a another embodiment of a light emitting module 300 is presented. FIG. 3a presents a cross-section along a plane that is substantially parallel to the base 108 of the housing 302 or substantially parallel to the luminescent element. The figure is drawn as if the viewer looks via the light exit window inside the cavity and for clarity the luminescent element is not shown. The luminescent element is provided as a layer and forms the light exit window thereby enclosing together with the housing 302 the cavity. The light emitting module 300 has a base on which solid state light emitter 112 on a substrate 304 are provided. The solid state light emitters 112 emit light towards the luminescent element. In the centre of the cavity is provided a thermal conductor 104 of which a shape of the cross-section is hexagonal. The thermal conductor 104 is thermally coupled to the luminescent element (not shown) and thermally coupled to the thermal coupling interface (not shown). The thermal coupling interface may be provided at the back side of the light emitting module 300. Further, the light emitting module 300 has a housing 302 which is of heat conducting material having a thermal conductivity that is better than a thermal conductivity of a material with which the cavity is filled. The thermal conductivity of the housing 302 may be comparable with the thermal conductivity of the thermal conductor 104. The housing 302 is also thermally coupled to the luminescent element and thermally coupled to the thermal coupling interface.

The luminescent element (not shown) may also be provided on a (heat conductive) support structure and the thermal conductor may be thermally coupled to the support structure.

Figure 3B:
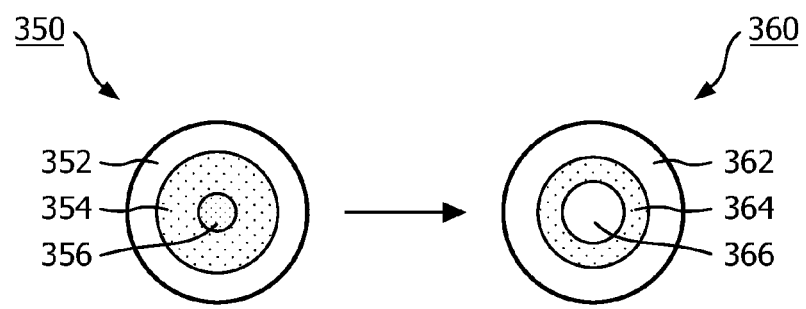

FIG. 3b presents the effect of the use of the thermal conductor 104 in the embodiment of the light emitting module 300. At the left end a first temperature gradient 350 is presented of a luminescent element of an emitting module that is a layer which forms the light exit window. The first temperature gradient 350 is related to a light emitting module that is similar to the light emitting module 300, but has no thermal conductor 104 within the cavity. In operation, a first zone 356 in a centre of the luminescent element becomes relatively hot. A second zone 354 around the centre gets an intermediate temperature, and a third zone 352 which is closest to the thermal conductive housing gets a relatively low temperature. The first temperature gradient 350 may be used to determine a position of the thermal conductor 104 within the cavity. If the first zone 356 is directly thermally coupled via the thermal conductor 104 to the thermal coupling interface, a relatively large temperature difference is obtained between both ends of the thermal conductor and a relatively large heat flow from the luminescent material towards the thermally coupling interface is obtained. Thus, as seen at the right end of FIG. 3b, a second temperature gradient 360 is obtained if the thermal conductor 104 is used in the light emitting module 300 of FIG. 3a. A first zone 366 close to the centre of the luminescent element, and a third zone 362 close to a wall of the housing 302 have a thermal path with a low thermal resistance to the thermal coupling interface and as such maintain a relatively low temperature if the light emitters 112 are in operation. In between the first zone 366 and the third zone 362 is a second zone 364 which obtains an intermediate temperature if the light emitting module 300 is in operation. Thus, the luminescent element does not become relatively hot at any specific area and as such the luminescent element is subject to less deterioration and has, consequently, a longer life-time.

Figure 4A:
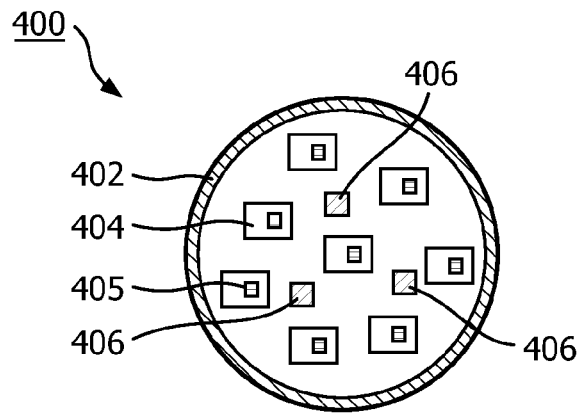
Figure 4B:
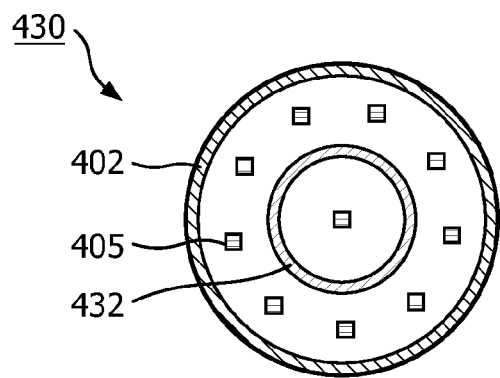
Figure 4C:
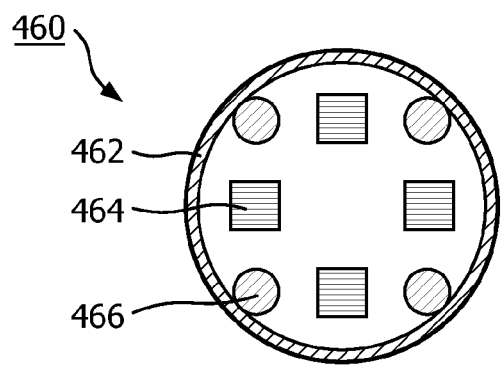

FIGS. 4a to 4c present cross-sections of variations to the light emitting module 300 of FIG. 3a.

A first variation of a light emitting module 400 is presented in FIG. 4a. A wall of the housing 402 is not specifically made of a material that well conducts heat. In the cavity are provided three thermal conductors 406 that have a square shaped cross-section. Further, on a base of the light emitting module are provided a plurality of solid state light emitters 405 which are provided on a substrate 404. The thermal conductors 406 are positioned at such locations within the cavity that the light emission paths of the solid sate light emitters 405 towards the luminescent element are minimally disturbed.

A second variation of a light emitting module 430 is presented in FIG. 4b. The solid state light emitters 405 are not provided on a substrate, but are directly provided on the base of the housing 402. One solid state light emitter 405 is positioned in the centre of the cavity, and the other solid sate light emitters 405 are arranged in a circle close to the wall of the housing 402. In the embodiment of FIG. 4b, a thermal conductor 432 is made of a light transmitting material with a high thermal conductivity. Further, the thermal conductor 432 is manufactured in the shape of a ring and the ring shaped thermal conductor is arranged in between the one solid state light emitter 405 in the centre and the other solid state light emitters 405. Because the thermal conductor is light transmitting, optically seen there is one cavity. Further, the ring shaped thermal conductor 432 has a relatively large contact area with the luminescent element and the thermal coupling interface and as such provides a thermal path with a low thermal resistance from the luminescent element towards the thermal coupling interface.

In an embodiment, the thermal conductor 432 is opaque and forms a wall which divides the cavity into two sub-cavities. One luminescent element (not shown), which forms the light exit window, is shared by the two sub-cavities and due to light-guiding in the luminescent element or a carrier layer on which the luminescent element is provided, the visibility of the internal wall (formed by the thermal conductor 432) is suppressed. Further, the thermal conductor 432 may comprises holes which allow the transmission of light between the sub-cavities to allow light mixing.

It is further to be noted that the thermal conductor 432 has a ring-shaped cross-section, however, in other embodiments the shape of the cross-section may be different, for example, rectangular or triangular. Further, the thermal conductor 432 may be a wall inside the cavity which subdivides the cavity in two sub-cavities. The wall may be manufactured of a light transmitting material, or may be opaque and have some holes or openings to allow the transmission of light from one sub-cavity to the other sub-cavity.

A third variation of a light emitting module 460 is presented in FIG. 4c. The solid state light emitters 464 are relatively large. For example, the solid state light emitters are organic light emitting diodes which have a large light emitting surface. Further, the wall of the housing 462 is thermal conductive. In the cavity are provided four thermal conductors 466 which are positioned close to the wall of the housing 462, and more specifically, the thermal conductors 466 are thermally coupled to the thermal conductive wall of the housing 462. The thermal coupling between the thermal conductors 466 and the thermal conductive wall provides a heat conductive path with a lower heat resistance. Further, the thermal conductors 466 are positioned at a location where they disturb the light emission path of the solid state light emitters 464 only to minor extent.

The thermal conductive wall of the housing 462 may, for example, be made of a metal such as aluminum and a surface of the wall facing the cavity may be coated with a light reflecting material. In other embodiments the wall is made of thermal conductive plastics, such as, for example, polyamides filled with thermally conductive particles.

Another variation of the light emitting module of 460 could be that the thermal coupling interface is not provided at the back side of the housing 462, which is the side of the light emitting module 460 that is opposite the light exit window, but the thermal coupling interface is provided at the circumference of the wall of the housing 462. In such an embodiment, the wall of the housing 462 may be provided with, for example, metal fins that act as a heat sink.

Figure 5A:
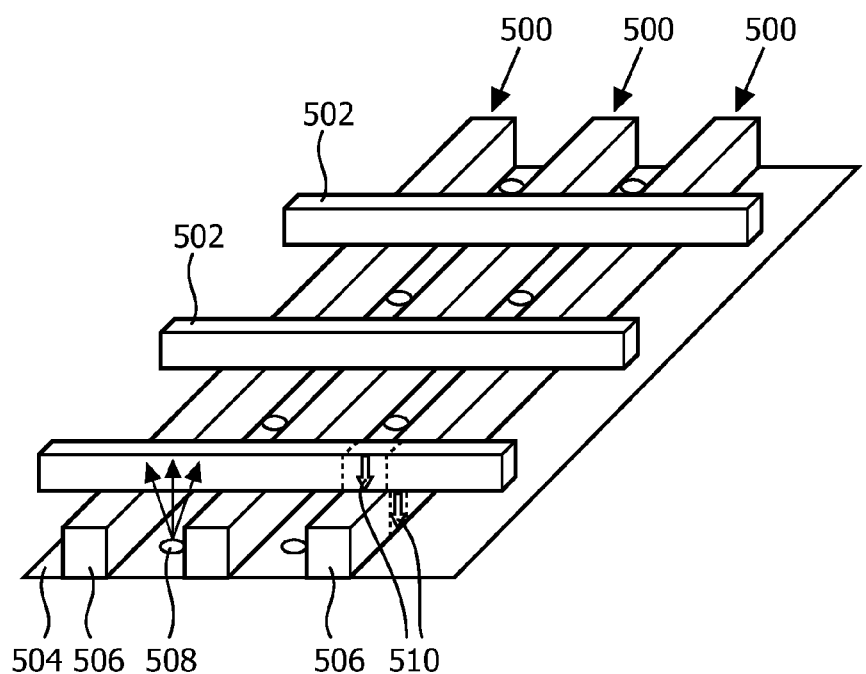

FIG. 5a presents another embodiment of a thermal conductor 500. The thermal conductor 500 is a combination of thermal conductive bars 502, 506 which are crosswise arranged on top of each other. The luminescent element may be provided on the top surface of the bars 502 and as such a relatively large contact surface is present between the luminescent element and the thermal conductor 500, which consequently results in a good thermal coupling between the thermal conductor 500 and the luminescent element. Further, the bottom surface of the bars 506 may be arranged on a base 504 of the cavity and may be thermally coupled to the thermal coupling interface, and as such provide a good thermal coupling to the thermally coupling interface. At points where the bars 502, 506 cross each other, heat 510 which is received by the upper bars 502 from the luminescent element may be transported towards the lower bars 506 which provide the heat 510 via the base to the thermal coupling interface. For clarity a plurality of solid state light emitters 508 are schematically presented in FIG. 5 and the light emitted by the solid state light emitters 508 is transmitted through the spaces in between the bars 502, 506 towards the luminescent element. The presented construction serves a dual purpose: light missing between the spaces between the bars 502, 506 and heat spreading through the light emitting module.

Figure 5B:
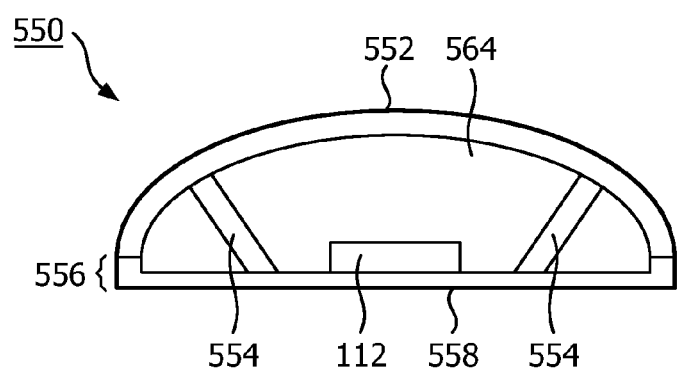

FIG. 5b presents a cross-section of an alternative embodiment of a light emitting module 550. The housing 556 of the light emitting module 550 has to a limited extent walls and mainly consists of a base 558. A cavity 564 is enclosed by the housing 556 and a luminescent element 552 which is formed as a curved surface. A light exit window of the light emitting module 550 is formed by the luminescent element 552. An edge of the luminescent element 552 is in contact with the housing 556. Within the cavity is provided a solid state light emitter, which may be a Light Emitting Diode or, for example, a laser Light Emitting Diode. Further, the cavity 564 is filled with a cavity material. Inside the cavity are also provided thermal conductors 554 which are thermally coupled to the base at one end of the thermal conductors 554 and are thermally coupled to the luminescent element 552 at the other end of the thermal conductors 554. The thermal conductors 554 are bars of a heat conductive material which has a better heat conductivity than a heat conductivity of the cavity material.

Figure 6A:
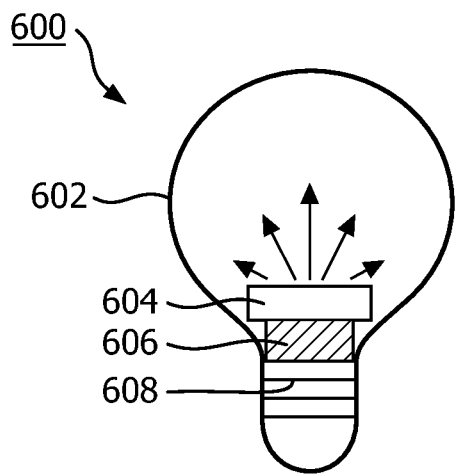

FIG. 6a presents a lamp 600 according to a second aspect of the invention. The lamp 600 has the shape of a traditional light bulb and the glass 602 of the bulb may be diffusely translucent. The lower part 608 of the lamp 600 contains a driving circuitry to provide, for example, mains conversion and/or dimming and the driving circuitry controls the current to the solid state light emitter(s) and is for connecting the lamp 600 to the electrical power and may be manufactured from metal which may be used as a heat sink. Alternatively, additional heat sinks may be present around the socket, typically using an aluminum casing with a large surface area from fins. The lamp 600 comprises at least one light emitting module 604 according to the first aspect of the invention. The light emitting module 604 may be connected with a heat conducting material 606 to the base 608 of the lamp 600. It is to be noted that that in other embodiments of the lamp 600, the lamp may have the shape of a light tube.

Figure 6B:
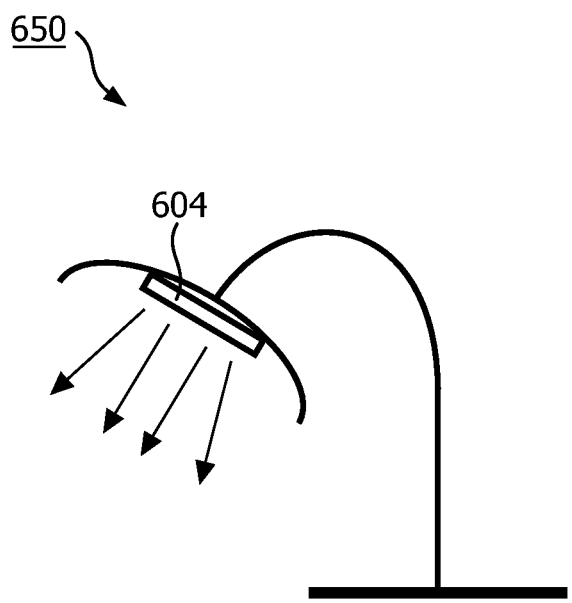

FIG. 6b shows a luminaire 650 according to the third aspect of the invention. The luminaire 650 comprise at least one light emitting module 604 according to the first aspect of the invention. If the luminaire is, for example, manufactured of metal, the light emitting module 604 may be thermally coupled to the luminaire 650 such that the luminaire 650 acts as a heat sink.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A light emitting module comprising
   a housing comprising a light exit window at a first side of the housing and a base at a second side of the housing being different from the first side, the housing enclosing a cavity comprising a light-transmitting cavity material comprising a liquid or being selected from the group consisting of silicone, silicate, alkylsilicate, a glass or a ceramic,
   a solid state light emitter provided within the cavity and being coupled to the base, the solid state light emitter is configured to emit light of the first color range into the cavity,
   a luminescent element being optically arranged in between the solid state light emitter and the light exit window, the luminescent element comprising luminescent material for converting at least a part of the light of the first color range into light of a second color range being different from the first color range,
   a thermal conductor being arranged within the cavity and having a thermal conductivity that is higher than a thermal conductivity of the cavity material, the thermal conductor being thermally coupled to the luminescent element and being thermally coupled to the base.

2. A light emitting module according to claim 1, wherein the base comprises a thermal coupling interface for thermally coupling the light emitting module to a heat sink.

3. A light emitting module according to claim 1, wherein the thermal conductor is of a light transmitting material and is optically coupled to the cavity material.

4. A light emitting module according to claim 1, wherein the thermal conductor comprises a material selected from the group consisting of copper, aluminum, a alumina ceramic, a born nitride ceramic, aluminum nitride, beryllium oxide, zinc oxide, zinc, and silver.

5. A light emitting module according to claim 1, wherein a first surface of the thermal conductor that is facing the cavity is light reflective or a light reflective layer is provided on the first surface.

6. A light emitting module according to claim 1, wherein a second surface of the thermal conductor that is facing towards the luminescent element is light reflective or a light reflective layer is provided on the second surface.

7. A light emitting module according to claim 1, wherein a shape of a cross-section of the thermal conductor along an imaginary plane parallel to the base is a circle, an ellipse or a hexagon.

8. A light emitting module according to claim 1, wherein the base is a heat conductive printed circuit board.

9. A light emitting module according to claim 1, wherein the thermal conductor is coupled to the base and/or to the luminescent element with a heat conductive adhesive for providing a thermal coupling between the thermal conductor and the base and/or between the thermal conductor and the luminescent element.

10. A light emitting module according to claim 1, wherein a position of the thermal conductor within the cavity is defined by at least one of the following criteria:
  i) the thermal conductor touches the luminescent element at a specific location where the luminescent element would have the highest temperature if the solid state light emitter is in operation and if the thermal conductor would not be available,
  ii) the length of the thermal conductor is minimal at the position,
  iii) the light output is maximal compared to another position of the thermal conductor within the cavity,
  iv) the light output along the light exit window is to a maximum degree homogeneous compared to another position of the thermal conductor within the cavity.

11. A light emitting module according to claim 1, wherein the light emitting module comprises a plurality of thermal conductors, each thermal conductor being arranged within the cavity and having a thermal conductivity that is higher than a thermal conductivity of the cavity material, each thermal conductor being thermally coupled to the luminescent element and being thermally coupled to the base.

12. A light emitting module according to claim 1, wherein the housing comprises a wall of a material having a thermal conductivity that is higher than the thermal conductivity of the cavity material, the wall being interposed between the light exit window and the base and the wall being thermally coupled to the luminescent element and the base.

13. A luminaire comprising a light emitting module according to claim 1.

* * * * *